United States Patent
Gardner et al.

[11] Patent Number: 5,811,222
[45] Date of Patent: Sep. 22, 1998

[54] METHOD OF SELECTIVELY EXPOSING A MATERIAL USING A PHOTOSENSITIVE LAYER AND MULTIPLE IMAGE PATTERNS

[75] Inventors: Mark I. Gardner, Cedar Creek; Derick J. Wristers; H. Jim Fulford, Jr., both of Austin, all of Tex.

[73] Assignee: Advanced Micro Devices, Inc., Sunnyvale, Calif.

[21] Appl. No.: 668,688

[22] Filed: Jun. 24, 1996

[51] Int. Cl.$^6$ ............................................. G03F 7/20
[52] U.S. Cl. .................... 430/312; 430/394; 430/396
[58] Field of Search .................... 430/312, 394, 430/396, 397

[56] References Cited

U.S. PATENT DOCUMENTS

| | | | |
|---|---|---|---|
| 4,440,493 | 4/1984 | Hiraga | 355/86 |
| 4,591,540 | 5/1986 | Bohlen et al. | 430/22 |
| 5,340,700 | 8/1994 | Chen et al. | 430/312 |
| 5,397,715 | 3/1995 | Miller | 437/27 |
| 5,503,959 | 4/1996 | Langston | 430/312 |
| 5,532,090 | 7/1996 | Borodovsky | 430/5 |
| 5,532,114 | 7/1996 | Bae | 430/312 |

OTHER PUBLICATIONS

M. Ono et al., "A 40 nm Gate Length n–Mosfet," IEEE Transactions on Electron Devices, vol. 42, No. 10, (1995), pp. 1822–1830.

Primary Examiner—Kathleen Duda
Attorney, Agent, or Firm—Skjerven, Morrill, MacPherson, Franklin & Friel LLP; David M. Sigmond

[57] ABSTRACT

A method of selectively exposing a material over a substrate is disclosed. The method includes forming a material over a semiconductor substrate, forming a photosensitive layer over the material, projecting a first image pattern onto the photosensitive layer that defines a first boundary for the material, projecting a second image pattern onto the photosensitive layer after projecting the first image pattern such that the second image pattern partially overlaps the first image pattern and defines a second boundary for the material, and removing portions of the photosensitive layer corresponding to the first and second image patterns. Preferably, the first and second image patterns are essentially identical to and laterally shifted with respect to one another. In this manner, the photosensitive layer selectively exposes the material adjacent to the first and second boundaries while covering the material between the first and second boundaries, and the distance between the first and second boundaries decreases as the overlap between the first and second image patterns decreases. Advantageously, the first and second boundaries can be closer than the minimum resolution of the photolithographic system used to pattern the photosensitive layer.

30 Claims, 7 Drawing Sheets

METHOD OF SELECTIVELY EXPOSING A MATERIAL USING A PHOTOSENSITIVE LAYER AND MULTIPLE IMAGE PATTERNS

BACKGROUND OF THE INVENTION

1. Field of the Invention

The present invention relates to integrated circuit manufacturing, and more particularly to selectively exposing a material on a semiconductor substrate.

2. Description of Related Art

Photolithography is frequently used in semiconductor fabrication to selectively expose regions of a material on a semiconductor wafer or substrate. Typically, the wafer is cleaned and prebaked to drive off moisture and promote adhesion, an adhesion promoter is deposited on the wafer, a few drops of photoresist are deposited onto the spinning wafer to provide a uniform layer, the wafer is soft baked to drive off remaining solvents, the wafer is put into a photolithographic system and exposed to a radiation pattern, and then the photoresist is developed. Positive photoresist, in which the developer removes the irradiated regions, is usually used. The photoresist is further hard baked to improve its resistance, and then the wafer is subjected to an additive process (such as ion implantation) or a subtractive process (such as etching) using the photoresist as a mask. Thereafter, the photoresist is stripped.

Photolithographic systems often use a radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step, whereas a reticle transfers a pattern onto only a portion of the wafer.

The three major methods of optically transferring a pattern on a mask or reticle to a photoresist-coated wafer include contact printing, proximity printing, and projection printing. In contact printing, the mask is clamped against a photoresist-coated wafer. Although this optimizes image transfer and resolution, the contacting process results in mask defects. In proximity printing, the mask and photoresist are spaced by a small distance. Although this overcomes the defect problems associated with contact printing, it also requires extremely flat wafers and masks. In projection printing, lens elements or mirrors are used to focus the mask or reticle image on the photoresist, which is spaced from the mask or reticle by a large distance. Several projection printing techniques have been developed, including projection scanners and step and repeat systems. Projection scanners use a reflective spherical mirror to project the mask onto the wafer by scanning the wafer and the mask with a narrow arc of radiation. Step and repeat systems (steppers) project an image only onto a portion of the wafer. Multiple images of the reticle pattern are stepped and repeated over the entire wafer using multiple exposures. The reticle pattern is typically 2× to 20× the size of the image on the wafer due to reduction by the lens. However, non-reduction (1×) steppers offer a larger field, thereby allowing more than one pattern to be printed at each exposure.

Step and repeat systems often use a mercury-vapor lamp as the illumination source. In mercury-vapor lamps, a discharge arc of high-pressure mercury vapor emits a characteristic spectrum that contains several sharp lines in the ultraviolet region—the I-line (365 nm), the H-line (405 nm) and the G-line (436 nm). Step and repeat systems are designed, for instance, to operate using the G-line, the I-line, a combination of the lines, or at deep UV (240 nm). To obtain the proper projection, high power mercury-vapor lamps are used that draw 200 to 1,000 watts and provide ultraviolet intensity on the order of 100 milliwatts/cm$^2$. In some systems, air jets cool the lamp, and the heated air is removed by an exhaust fan. The reticle is typically composed of glass with relatively defect-free surfaces and a high optical transmission at the radiation wavelength. Popular reticle glasses include soda-lime glass, borosilicate glass, and quartz. Quartz has a low thermal expansion coefficient and high transmission for near and deep ultraviolet light. Although quartz tends to be expensive, it has become more affordable with the development of high quality synthetic quartz material.

In general, the term "resolution" describes the ability of an optical system to distinguish closely spaced objects. The minimum resolution of a photolithographic system is the dimension of minimum linewidth or space that the machine can adequately print or resolve. While optical photolithography continues to be the dominant technology because it is well established and is capable of implementing sub-micron resolution at least as low as 0.35 microns using current equipment, as feature sizes approach 0.5 microns and below, and these features extend across wafer areas of a square inch and more, extensive efforts are being directed at developing alternative technologies. Electron-beam, ion-beam, and x-ray technologies have demonstrated patterning capabilities that extend beyond the limits of optical systems. Electron-beams and ion-beams can also directly write image patterns onto the photoresist without the use of a mask or reticle, for instance by using a controlled stage to position the wafer beneath the tool. However, these alternative approaches have certain drawbacks. For instance, electron-beam lithography has low throughput, x-ray lithography has difficulties with fabricating suitable masks, and ion-beam lithography has low throughput and difficulties with obtaining reliable ion sources.

Thus, workers in the art recognize that there are obvious incentives for trying to push the currently dominant technology (optical photolithography) into the fine-line region. Such an effort, if successful, has the potential for significantly better patterning capabilities.

Accordingly, a need exists for improvements in semiconductor processing techniques employing optical photolithographic systems in order to pattern fine-line dimensions of 0.5 microns and below.

SUMMARY OF THE INVENTION

The invention addresses the forementioned need by providing an improved method of selectively exposing a material over a semiconductor substrate. The method includes forming a material over a semiconductor substrate, forming a photosensitive layer over the material, projecting a first image pattern onto the photosensitive layer that defines a first boundary for the material, projecting a second image pattern onto the photosensitive layer after projecting the first image pattern such that the second image pattern partially overlaps the first image pattern and defines a second boundary for the material, and removing portions of the photosensitive layer corresponding to the first and second image patterns. In this manner, the photosensitive layer selectively exposes the material adjacent to the first and second boundaries while covering the material between the first and second boundaries. Advantageously, the first and second boundaries can be closer than the minimum resolution of the photolithographic system used to pattern the photosensitive layer.

Preferably, the material includes first and second portions adjacent to and on opposite sides of a central portion, the first boundary is between the first and central portions, the second boundary is between the central and second portions, the first image pattern covers the first portion without covering the central and second portions, and the second image pattern covers the second portion without covering the first and central portions.

It is also preferred that the first and second image patterns are formed using separate radiation exposure steps, and are essentially identical to and laterally shifted with respect to one another. The lateral shift reduces the size of a minimum linewidth region by irradiating a portion of the minimum linewidth region.

The first and second image patterns can be provided by projecting radiation through a reticle while the reticle has a first position with respect to the substrate, and then projecting radiation through the reticle while the reticle has a second position with respect to the substrate, with the second position laterally shifted with respect to the first position. Alternatively, the first and second image patterns can be provided by projecting radiation through a first reticle having a first radiation-transmitting pattern, and then projecting radiation through a second reticle having a second radiation-transmitting pattern, with the second radiation-transmitting pattern essentially identical to and laterally shifted with respect to the first radiation-transmitting pattern. Furthermore, the first and second image patterns can be laterally shifted with respect to one another along a single coordinate axis, or along first and second mutually orthogonal coordinate axes.

The invention is well-suited for forming extremely narrow gate electrodes using photoresist as the photosensitive layer and polysilicon as the material to be selectively exposed and subsequently etched. Advantageously, a polysilicon gate electrode formed using the present invention can have an extremely narrow length, for instance 0.2 microns and below.

These and other aspects of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
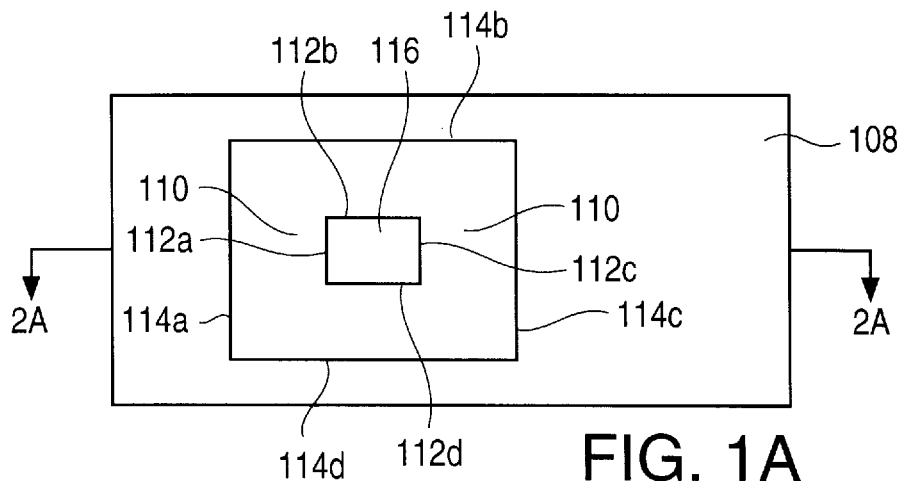
FIGS. 1A–1E show top plan views of successive process steps for forming a gate electrode using first and second essentially identical image patterns laterally shifted with respect to one another along a single coordinate axis in accordance with a first embodiment of the invention.

In the drawings, depicted elements are not necessarily drawn to scale and like or similar elements may be designated by the same reference numeral throughout the several views.

FIGS. 1A–1E show top plan views of successive process steps for forming a gate electrode using first and second essentially identical image patterns laterally shifted with respect to one another along a single coordinate axis in accordance with a first embodiment of the invention, and FIGS. 2A–2E show cross-sectional views of FIGS. 1A–1E, respectively.

Figure 2A:
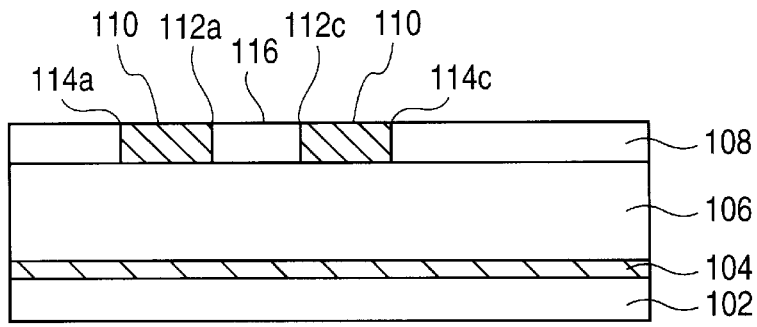
FIGS. 2A–2E show cross-sectional views of FIGS. 1A–1E, respectively.

In FIGS. 1A and 2A, silicon substrate 102 includes an 8 micron thick P-type epitaxial surface layer with a <100> orientation and a resistivity of 12 ohm-cm. Preferably, the epitaxial surface layer is disposed on a P+ base layer (not shown). Substrate 102 is suitable for integrated circuit manufacture. A blanket layer of gate oxide 104, composed of silicon dioxide, is formed on the top surface of substrate 102 using tube growth at a temperature of 700° to 1000° C. in an $O_2$ ambient. Gate oxide 104 has a thickness in the range of 30 to 150 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before being etched by implanting arsenic with a dosage in the range of $1\times10^{15}$ to $5\times10^{15}$ atoms/cm$^2$ and an energy in the range of 2 to 50 kiloelectron-volts. However, it is generally preferred that polysilicon 106 be doped during a later process step when a dopant is introduced into substrate 102.

Photoresist layer 108 is disposed on polysilicon 106. Photoresist layer 108 is deposited as a continuous layer and selectively irradiated using a photolithographic system, such as a step and repeat optical projection system, in which I-line ultraviolet light from a mercury-vapor lamp is projected through a reticle and a focusing lens to obtain image pattern 110 on photoresist layer 108. Image pattern 110 includes inner borders 112 and outer borders 114. Inner border 112a is adjacent and orthogonal to inner border 112b, inner border 112b is adjacent and orthogonal to inner border 112c, inner border 112c is adjacent and orthogonal to inner border 112d, and inner border 112d is adjacent and orthogonal to inner border 112a. Likewise, outer border 114a is adjacent and orthogonal to outer border 114b, outer border 114b is adjacent and orthogonal to outer border 114c, outer border 114c is adjacent and orthogonal to outer border 114d, and outer border 114d is adjacent and orthogonal to outer border 114a. Inner borders 112a and 112c are spaced by 0.4 microns, as are inner borders 112b and 112d. Outer borders 114a and 114c are spaced by 1.2 microns, as are outer borders 114b and 114d. Region 116 of photoresist layer 108 is not exposed to image pattern 110. The length of region 116 between borders 112a and 112c is 0.4 microns, and the width of region 116 between borders 112b and 112d is 0.4 microns. Similarly, the length of image pattern 110 between borders 112a and 114a, 112b and 114b, 112c and 114c, and 112d and 114d is 0.4 microns. This represents the minimum resolution (i.e. linewidth and spacing) of the step and repeat system. Therefore, if region 116 is used to define the length of a gate electrode in polysilicon 106, and anisotropic etching is used, then the gate length will be 0.4 microns. However, the present invention provides for far narrower gate lengths.

Figure 1B:
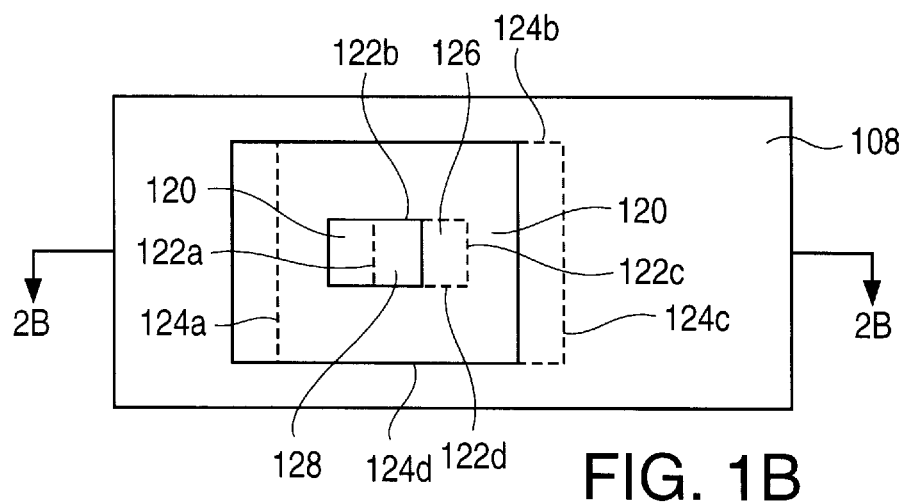
Figure 2B:
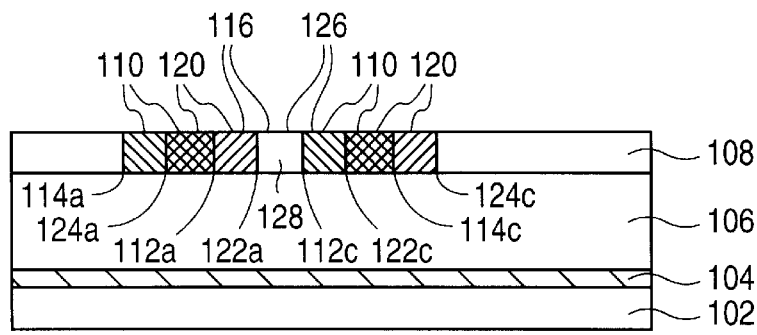

In FIGS. 1B and 2B, photoresist layer 108 is selectively irradiated again using the step and repeat system, and image pattern 120 is projected onto photoresist 108. Image pattern 120 includes inner borders 122 and outer borders 124, shown as the broken lines. Inner border 122a is adjacent and orthogonal to inner border 122b, inner border 122b is adjacent and orthogonal to inner border 122c, inner border 122c is adjacent and orthogonal to inner border 122d, and inner border 122d is adjacent and orthogonal to inner border 122a. Likewise, outer border 124a is adjacent and orthogonal to outer border 124b, outer border 124b is adjacent and orthogonal to outer border 124c, outer border 124c is adjacent and orthogonal to outer border 124d, and outer border 124d is adjacent and orthogonal to outer border 124a. Inner borders 122a and 122c are spaced by 0.4 microns, as are inner borders 122b and 122d. Outer borders 124a and 124c are spaced by 1.2 microns, as are outer borders 124b and 124d. Region 126 of photoresist layer 108 is not exposed to image pattern 120. The length of region 126 between borders 122a and 122c is 0.4 microns, as is the width of region 126 between borders 122b and 122d. Similarly, the length of image pattern 120 between borders 122a and 124a, 122b and 124b, 122c and 124c, and 122d and 124d is 0.4 microns.

Image pattern 120 is superimposed on image pattern 110 (or the region of photoresist layer 108 irradiated by image pattern 110) for the sake of comparison. However, it is critical to note that image patterns 110 and 120 are projected using separate exposure steps. That is, image pattern 110 is projected onto photoresist layer 108, the exposure is discontinued, and then image pattern 120 is projected onto photoresist layer 108. Therefore, although image patterns 110 and 120 partially overlap, image patterns 110 and 120 are not simultaneously projected onto photoresist layer 108. It should also be noted that image pattern 120 is essentially identical to, and laterally shifted by 0.2 microns along the x-axis with respect to image pattern 110. For instance, borders 114a and 124a are spaced by 0.2 microns, as are borders 112a and 122a, 112c and 124c, and 114c and 124c. Likewise, since image patterns 110 and 120 are not shifted with respect to one another along the y-axis, there is partial overlap and alignment between borders 112b and 122b, 112d and 122d, 114b and 124b, and 114d and 124d. The overlap between image patterns 110 and 120 occurs, for instance, in the 0.2 micron region between borders 112a and 124a, and in the 0.2 micron region between borders 114c and 124c. Of importance, region 128 of photoresist layer 108, which represents the overlap of regions 116 and 126, is outside both image pattern 110 and image pattern 120. In fact, region 128 is the only region of photoresist layer 108 inside borders 114 or borders 124 that remains unirradiated. The length of region 128 between borders 112c and 122a is 0.2 microns. Moreover, the length of region 128 is a function of the overlap between image patterns 110 and 120. The smaller the overlap (as border 112c approaches border 122a), the narrower region 128 becomes.

Figure 1C:
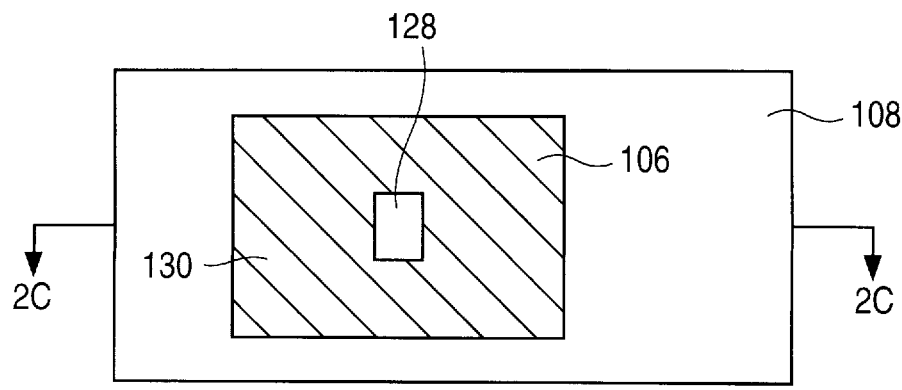
Figure 2C:
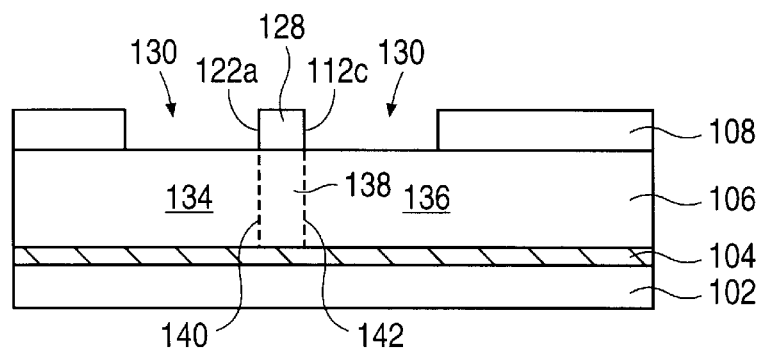

In FIGS. 1C and 2C, photoresist layer 108 is developed, and since photoresist layer 108 is positive-acting, the portions of photoresist 108 irradiated by image pattern 110, image pattern 120, or both are removed. As a result, photoresist 108 contains opening 130 that selectively exposes portions of polysilicon 106. For illustration purposes, region 128 of photoresist layer 108 defines first portion 134, second portion 136 and gate electrode portion 138 of polysilicon 106. First portion 134 and second portion 136 are adjacent to opposite edges of gate electrode portion 138. Boundary 140 (shown as broken lines) is located between first portion 134 and gate electrode portion 138, and boundary 142 (shown as broken lines) is located between second portion 136 and gate electrode portion 138. As is seen, boundary 140 is aligned with border 122a, and boundary 142 is aligned with border 112c. Thus, first portion 134 and second portion 136 of polysilicon 106 are exposed by opening 130 in photoresist layer 108.

Figure 1D:
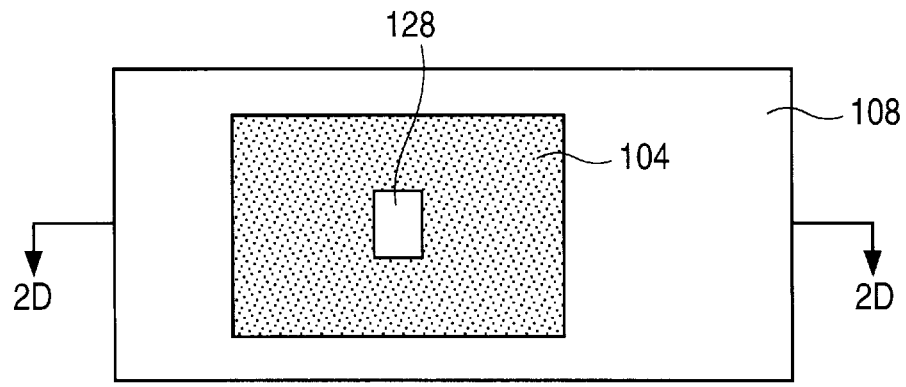
Figure 2D:
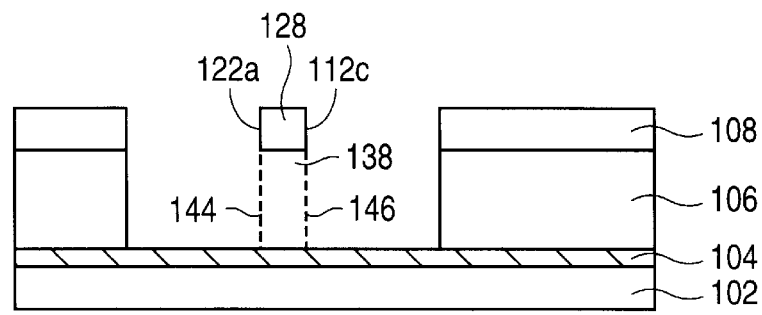

In FIGS. 1D and 2D, an anisotropic dry etch is applied through opening 130 that is highly selective of polysilicon 106. Photoresist layer 108 protects gate electrode portion 138 from the etch, but opening 130 exposes first portion 134 and second portion 136 to the etch. As a result, the etch completely removes first portion 134 to form first vertical edge 144 for gate electrode portion 138, and completely removes second portion 136 to form second vertical edge 146 for gate electrode portion 138. First vertical edge 144 is aligned with border 122a and corresponds to boundary 140, whereas second vertical edge 146 is aligned with border 112c and corresponds to boundary 142. Although the etch is highly selective of polysilicon, it is non-selective of silicon dioxide, so only a negligible amount of gate oxide 104 beneath first portion 134 and second portion 136 is removed, and substrate 102 is unaffected. Advantageously, gate electrode portion 138 provides an extremely narrow gate electrode, with a length of merely 0.2 microns, and a width of 0.4 microns, for an insulated-gate field-effect transistor (IGFET) such as an N-channel metal-oxide-semiconductor field-effect transistor (MOSFET).

Figure 1E:
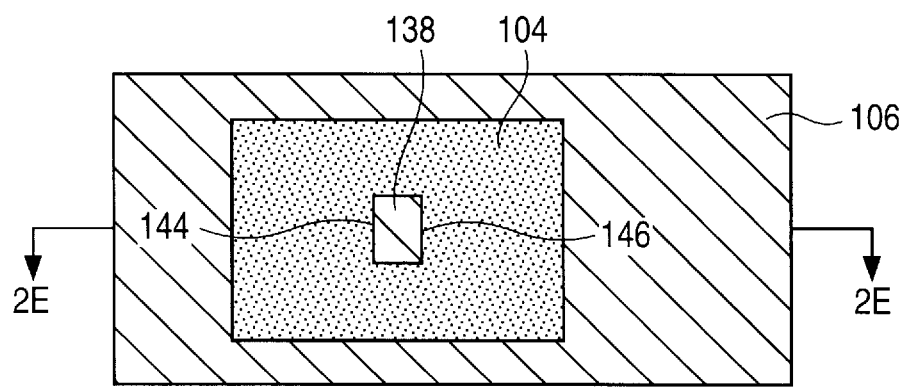
Figure 2E:
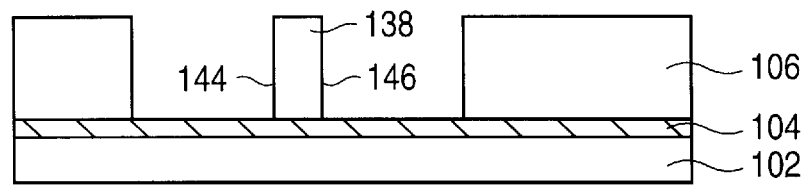

In FIGS. 1E and 2E, photoresist layer 108 is stripped, thereby exposing gate electrode portion 138 and the remaining unetched regions of polysilicon 106.

Figure 3A:
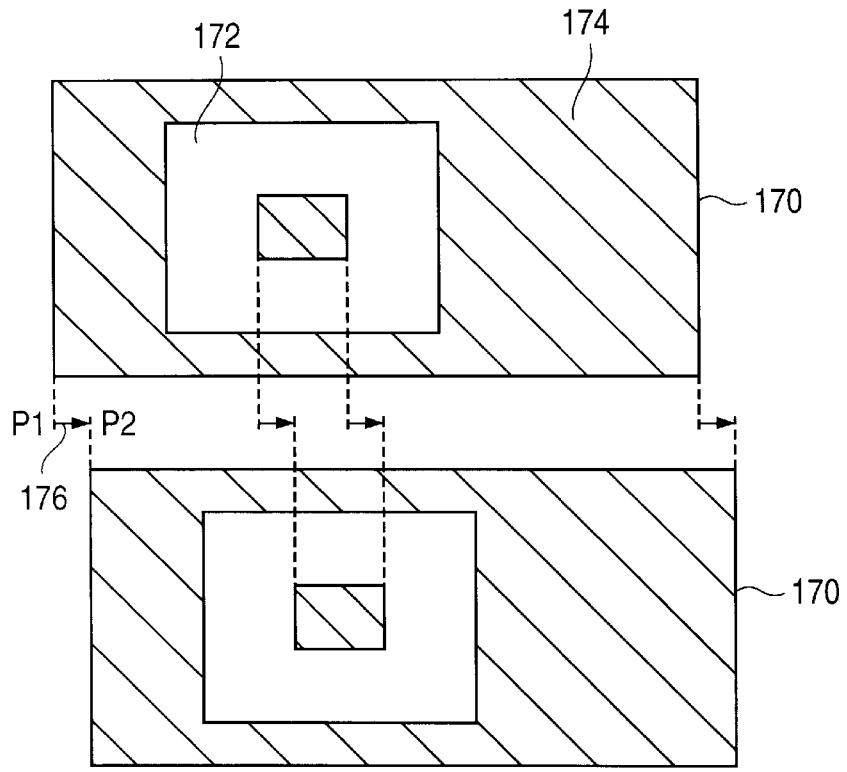
FIGS. 3A–3B show reticle(s) for forming the image patterns of FIGS. 1A–1E, and FIGS. 4A–4E show top plan views of successive process steps for forming a gate electrode using first and second essentially identical image patterns laterally shifted with respect to one another along first and second mutually orthogonal coordinate axes in accordance with a second embodiment of the invention.
Figure 3B:
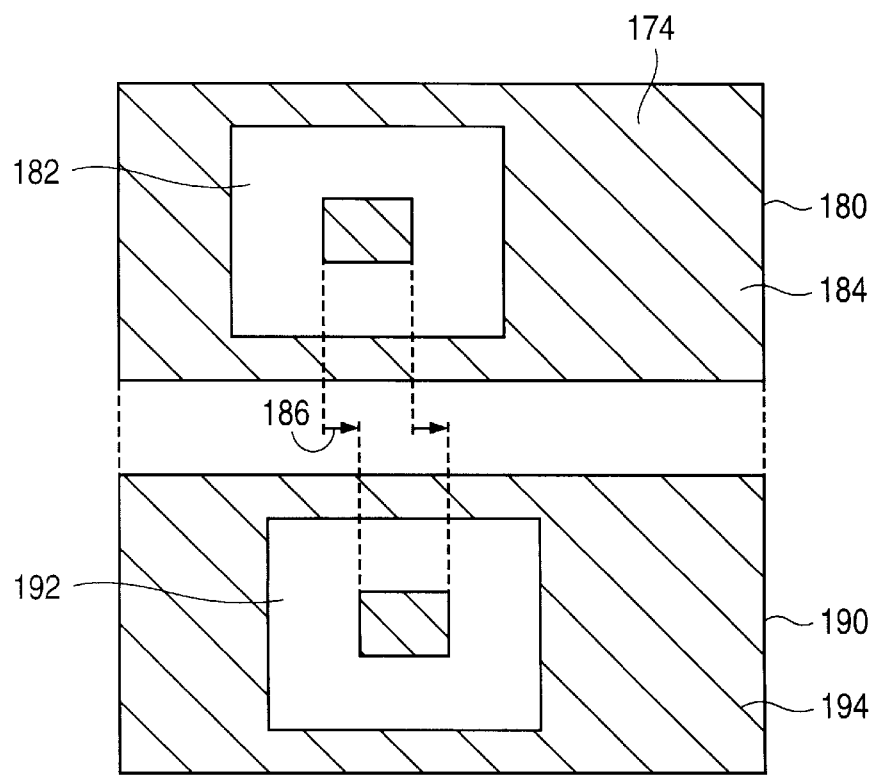

As previously mentioned, image patterns 110 and 120 are essentially identical to and laterally shifted with respect to one another. FIGS. 3A and 3B illustrate alternative embodiments for using a reticle (or reticles) to form image patterns 110 and 120.

In FIG. 3A, a single reticle is used for providing both first image pattern 110 and second image pattern 120. Reticle 170 includes radiation-transmitting pattern 172 and radiation-blocking pattern 174. As is seen, radiation-transmitting pattern 172 corresponds to the configuration of first image pattern 110, as well as second image pattern 120, although the dimensions of radiation-transmitting pattern 172 are larger than those of image patterns 110 and 120 since the step and repeat system includes a reduction lens between reticle 170 and photoresist layer 108. Reticle 170 is constructed with a chrome pattern disposed on a quartz base. The chrome pattern provides radiation-blocking pattern 174, and includes through-holes, or openings, that define radiation-transmitting pattern 172. Reticle 170 is disposed in a first position, P1, with respect to substrate 102, during a first exposure step when radiation is projected through reticle 170 to form first image pattern 110 on photoresist layer 108. Thereafter, the radiation is discontinued, and reticle 170 is repositioned to a second position, P2, with respect to substrate 102. The repositioning of reticle 170 from position P1 to position P2 is depicted by arrows 176, between the broken lines extending from similar regions of reticle 170. Accordingly, reticle 170 is laterally shifted along the x-axis, but not the y-axis, in order to displace second image pattern 120 by 0.2 microns along the x-axis with respect to first image pattern 110. When reticle 170 is in position P2, radiation is projected through reticle 170 during a second exposure step to form second image pattern 120 on photoresist layer 108. Advantageously, reticle 170 can be repositioned (or stepped) using the step and repeat system, which has an alignment tolerance on the order of 0.03 microns, to provide the first and second image patterns using a single reticle.

In FIG. 3B, first and second reticles are used for providing first image pattern 110 and second image pattern 120, respectively. Reticle 180, which includes radiation-transmitting pattern 182 and radiation-blocking pattern 184, is essentially identical to reticle 170. Reticle 190, which includes radiation-transmitting pattern 192 and radiation-blocking pattern 194, is essentially identical to reticle 180, except that radiation transmitting pattern 192 (and thus radiation-blocking pattern 194) is laterally shifted with respect to radiation-transmitting pattern 182 (and thus radiation-blocking pattern 184). Radiation-transmitting pattern 182 corresponds to the configuration of first image pattern 110, and radiation-transmitting pattern 192 corresponds to the configuration of second image pattern 120, although the dimensions of radiation-transmitting patterns 182 and 192 and the displacement therebetween are larger than those of image patterns 110 and 120 since the step and repeat system includes a reduction lens between the reticle in use and photoresist layer 108. Reticle 180 is disposed in a first position with respect to substrate 102 during a first exposure step when radiation is projected through reticle 180 to form first image pattern 110 on photoresist layer 108. Thereafter, the radiation is discontinued, and reticle 180 is replaced with reticle 190. Since the displacement between first image pattern 110 and second image pattern 120 is provided by reticles 180 and 190, reticle 190 is disposed in the same position as reticle 180 with respect to substrate 102. The displacement between radiation-transmitting patterns 182 and 192 is depicted by arrows 186, between the broken lines extending from similar regions of reticles 180 and 190. Accordingly, radiation-transmitting pattern 192 is laterally shifted along the x-axis, but not the y-axis, with respect to radiation-transmitting pattern 182, in order to displace second image pattern 120 by 0.2 microns along the x-axis with respect to first image pattern 110. When reticle 190 is in the first position, radiation is projected through reticle 190 during a second exposure step to form second image pattern 120 on photoresist layer 108. Advantageously, although two reticles are required, the step and repeat system need not adjust the relative positions of the reticles with respect to the substrate to provide the desired displacement between the first and second image patterns.

Furthermore, since radiation-transmitting pattern 182 can be a small portion of the entire radiation-transmitting pattern of reticle 180, and the radiation-transmitting pattern 192 can be a small portion of the entire radiation-transmitting pattern of reticle 190, reticles 180 and 190 can form other image patterns with various amounts of displacement or overlap therebetween. For instance, reticles 180 and 190 can form a first gate electrode with a length of 0.4 microns using 100% overlap between a first set of essentially identical image patterns over a first region, a second gate electrode with a length of 0.3 microns using 75% overlap between a second set of essentially identical image patterns over a second region, a third gate electrode with a length of 0.2 microns using 50% overlap between a third set of essentially identical image patterns over a third region, and a fourth gate electrode with a length of 0.1 microns using 25% overlap between a fourth set of essentially identical image patterns over a fourth region. The relative positions of the radiation-transmitting patterns for reticles 180 and 190 can be adjusted by appropriate shifting of the database coordinates that define the configurations of the chrome patterns on the quartz bases.

FIGS. 4A–4E show top plan views of successive process steps for forming a gate electrode using first and second essentially identical image patterns laterally shifted with respect to one another along first and second mutually orthogonal coordinate axes in accordance with a second embodiment of the invention. In the first embodiment (FIGS. 1A–1E), the second image pattern is displaced with respect to the first image pattern along a single coordinate axis. Although this can provide a gate electrode with an extremely narrow length, in certain applications it may also be desirable to provide the gate electrode with an extremely narrow width. The primary difference between the second embodiment and the first embodiment is that in the second embodiment, the second image pattern is displaced with respect to the first image pattern along both the x-axis and y-axis. Unless otherwise noted, the elements for the second embodiment (substrate 202, gate oxide 204, etc.) are similar to elements of the first embodiment (substrate 102, gate oxide 104, etc.), and the description of related elements and process steps need not be repeated.

Figure 4A:
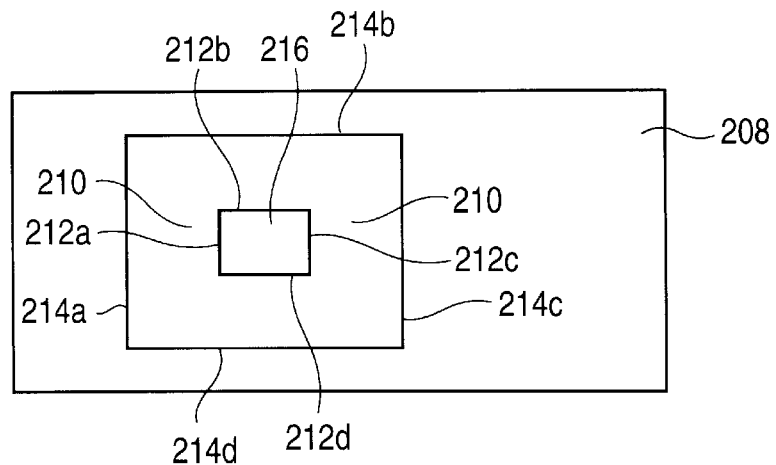

In FIG. 4A, photoresist layer 208 is disposed on polysilicon 206 (not shown), which is disposed on a gate oxide 204 (not shown), which is disposed on semiconductor substrate 202 (not shown). Image pattern 210 is projected onto photoresist layer 208. Image pattern 210 includes inner borders 212a, 212b, 212c and 212d, and outer borders 214a, 214b, 214c and 214d. Borders 212a and 214a, and 212c and 214c are spaced by 0.4 microns along the x-axis, and borders 212b and 214b, and 212d and 214d are spaced by 0.4 microns along the y-axis.

Figure 4B:
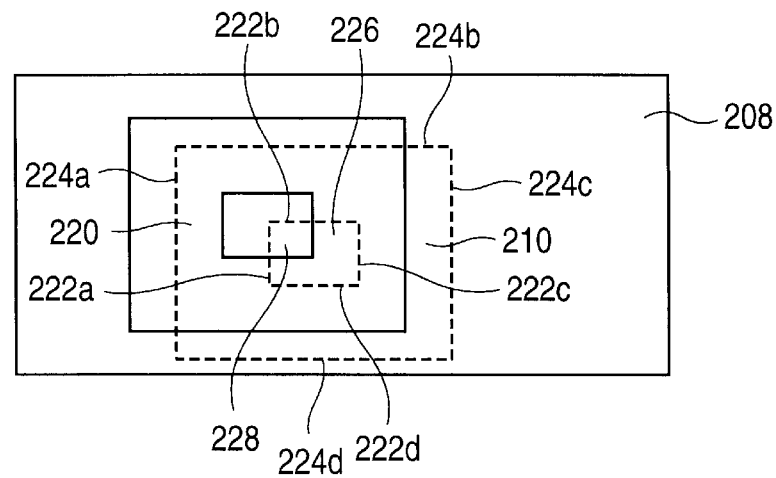

In FIG. 4B, image pattern 220 is projected onto photoresist layer 208. Image pattern 220, shown by the broken lines, includes inner borders 222a, 222b, 222c and 222d, and outer borders 224a, 224b, 224c and 224d. Borders 222a and 224a, and 222c and 224c are spaced by 0.4 microns along the x-axis, and borders 222b and 224b, and 222d and 224d are spaced by 0.4 microns along the y-axis. Thus, image pattern 220 is essentially identical to image pattern 210, except that image pattern 220 is displaced from image pattern 210 by 0.2 microns along the x-axis and 0.2 microns along the y-axis. As a result, region 228 of photoresist layer 208 has a length of 0.2 microns between borders 212c and 222a, and a width of 0.2 microns between borders 212d and 222b. This can be contrasted, for instance, with region 128 of photoresist layer 108, which has a width of 0.4 microns between borders 112d and 122b.

Figure 4C:
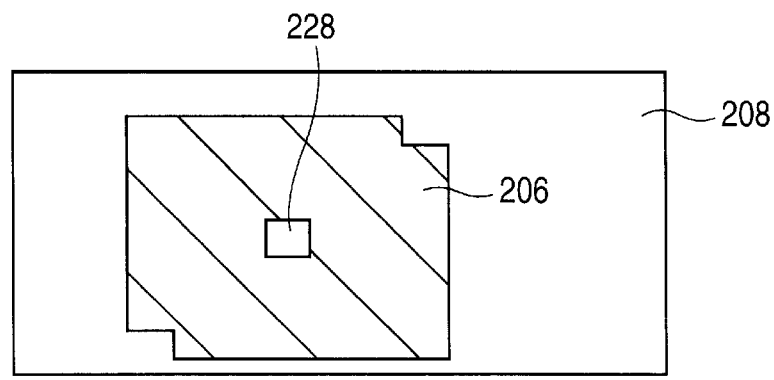
Figure 4D:
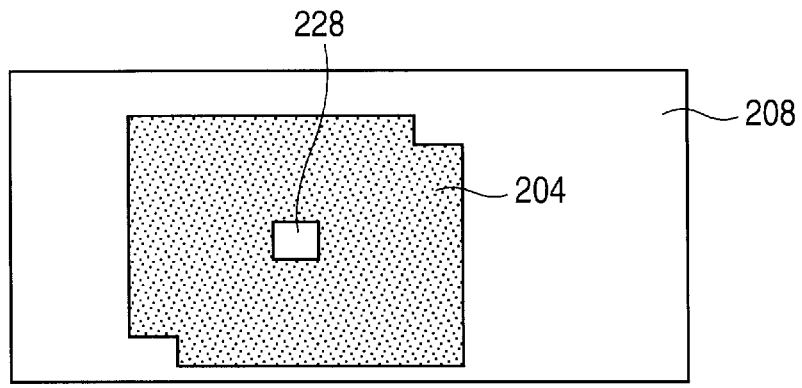
Figure 4E:
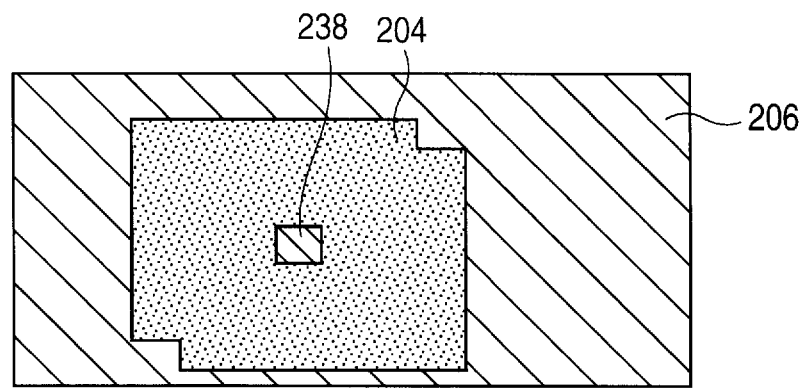

In FIG. 4C, the regions of photoresist layer 208 irradiated by first image pattern 210, second image pattern 220, or both are removed to selectively expose polysilicon 206, in FIG. 4D the exposed polysilicon is etched and removed, and in FIG. 4E photoresist layer 208 is stripped. Advantageously, gate electrode portion 238 has a length of 0.2 microns and a width of 0.2 microns.

Of course, image patterns 210 and 220 can be provided by stepping reticle 170 along both the x-axis and y-axis, or alternatively, by shifting radiation-transmitting pattern 192 of reticle 190 along both the x-axis and y-axis with respect to radiation-transmitting pattern 182 of reticle 180.

After the gate electrode (such as gate electrode portion 138 or 238) is formed, N-type source/drain regions for an N-channel MOSFET are formed in substrate 102. For instance, lightly doped source/drain regions are introduced by subjecting the structure to ion implantation of arsenic, at a dosage in the range of $1 \times 10^{13}$ to $5 \times 10^{14}$ atoms/cm$^2$ and an energy in the range of 2 to 50 kiloelectron-volts, using the gate electrode as an implant mask, so that lightly doped source/drain regions are self-aligned to the gate electrode and are doped N– with an arsenic concentration in the range of $1 \times 10^{17}$ to $1 \times 10^{18}$ atoms/cm$^3$ and a junction depth in the range of 100 to 1500 angstroms. Thereafter, an oxide layer with a thickness in the range of 600 to 2000 angstroms is conformally deposited over the exposed surfaces by CVD at a temperature in the range of 300° to 400° C., and the structure is subjected to a reactive ion etch (RIE) that forms sidewall spacers adjacent to the edges of the gate electrode and that removes the regions of gate oxide 104 outside gate electrode and spacers. Thereafter, heavily doped source/ drain regions are implanted into substrate 102 by subjecting the structure to ion implantation of arsenic, at a dosage in the range of $1 \times 10^{15}$ to $5 \times 10^{15}$ atoms/cm$^2$ and an energy in the range of 2 to 50 kiloelectron-volts, using the gate electrode and spacers as an implant mask. The heavily doped source/ drain regions are self-aligned to the spacers and are doped N+ with an arsenic concentration in the range of about $1 \times 10^{18}$ to $1 \times 10^{19}$ atoms/cm$^3$ and a junction depth in the range of 200 to 3000 angstroms. Preferably, the junction depth of heavily doped source/drain regions exceeds that of lightly doped source/drain regions, and the heavy dose of arsenic also provides sufficient doping to render the gate electrode conductive. Finally, the structure is annealed to remove crystalline damage and to activate and drive-in the implanted arsenic by applying a rapid thermal anneal on the order of 950° to 1050° C. for 10 to 60 seconds. The implanted arsenic in substrate diffuses both laterally and vertically, so that the source regions merge to provide a source and the drain regions merge to provide a drain.

Further processing steps in the fabrication of IGFETs typically include forming a thick oxide layer over the active regions, forming contact windows in the oxide layer to expose the gate electrode, source and drain, forming appropriate interconnect metallization in the contact windows, and forming a passivation layer over the interconnect metallization. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiments described above. For instance, the image patterns can be projected onto a photosensitive layer. The material to be selectively exposed through openings in the photosensitive layer can be a nitride, an oxide, a metal, a semiconductor, or any other material disposed on a semiconductor substrate. Different amounts of overlap (or lateral shifting) between the image patterns will result in different sizes and configurations of the exposed region of the material. If desired, three or more image patterns can be employed. Once selectively exposed, the material can be subjected to either an additive or subtractive operation.

The invention is particularly well-suited for fabricating N-channel MOSFETs, P-channel MOSFETs, CMOS devices and other types of IGFETs, as well as integrated capacitors, interconnect vias and lines, and various other circuit elements, particularly for high-performance microprocessors where high circuit density is essential. Although only a single FET has been described for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of selectively exposing a material over a semiconductor substrate, comprising the steps of:

forming a material over a semiconductor substrate;

forming a photosensitive layer over the material;

projecting a first image pattern onto the photosensitive layer, wherein the first image pattern defines a first boundary for the material;

projecting a second image pattern onto the photosensitive layer after projecting the first image pattern, wherein the second image pattern partially overlaps the first image pattern and defines a second boundary for the material; and removing portions of the photosensitive layer corresponding to the first and second image patterns, wherein the photosensitive layer selectively exposes the material adjacent to the first and second boundaries while covering the material adjacent to and between the first and second boundaries.

2. The method of claim 1, wherein:

the first image pattern includes four inner borders having a rectangular shape within four outer borders having a rectangular shape;

the second image pattern includes four inner borders having a rectangular shape within four outer borders having a rectangular shape;

one of the inner borders of the first image pattern defines the first boundary; and one of the inner borders of the second image pattern defines the second boundary.

3. The method of claim 2, wherein:

a first inner region within the four inner borders of the first image pattern is outside the first image pattern;

a second inner region within the four inner borders of the second image pattern is outside the second image pattern; and an overlap between the first and second inner regions defines where the photoresist layer covers the material between the first and second boundaries.

4. The method of claim 1, wherein:

the material includes first and second portions adjacent to and on opposite sides of a central portion, the first boundary is between the first and central portions and the second boundary is between the central and second portions;

the first image pattern covers the first portion without covering the central and second portions; and the second image pattern covers the second portion without covering the first and central portions.

5. The method of claim 1, wherein the first and second image patterns are formed using separate radiation exposure steps.

6. The method of claim 1, wherein the second image pattern is essentially identical to and laterally shifted with respect to the first image pattern.

7. The method of claim 6, wherein:

projecting the first image pattern onto the photosensitive layer includes projecting radiation through a reticle while the reticle has a first position with respect to the substrate; and projecting the second image pattern onto the photosensitive layer includes projecting radiation through the reticle while the reticle has a second position with respect to the substrate, wherein the second position is laterally shifted with respect to the first position.

8. The method of claim 6, wherein:
projecting the first image pattern onto the photosensitive layer includes projecting radiation through a first reticle having a first radiation-transmitting pattern; and
projecting the second image pattern onto the photosensitive layer includes projecting radiation through a second reticle having a second radiation-transmitting pattern, wherein the second radiation-transmitting pattern is essentially identical to and laterally shifted with respect to the first radiation-transmitting pattern.

9. The method of claim 6, wherein the second image pattern is laterally shifted with respect to the first image pattern along a single coordinate axis.

10. The method of claim 6, wherein the second image pattern is laterally shifted with respect to the first image pattern along first and second mutually orthogonal coordinate axes.

11. The method of claim 1, including applying an etch to selectively remove portions of the material that are selectively exposed by the photosensitive layer, thereby forming first and second edges in the material corresponding to the first and second boundaries, respectively.

12. The method of claim 1, wherein the photosensitive layer is photoresist and the material is polysilicon.

13. The method of claim 1, performed during the fabrication of an integrated circuit chip.

14. The method of claim 1, performed during the fabrication of an electronic system that includes a microprocessor, a memory and a system bus.

15. A method of selectively exposing a material over a semiconductor substrate, comprising the steps of:
forming a material over a semiconductor substrate, wherein the material includes a central portion between and adjacent to first and second portions;
forming a positive photoresist layer on the material;
projecting a first image pattern onto the photoresist layer, wherein the first image pattern covers the first portion without covering the central and second portions;
projecting a second image pattern onto the photoresist layer after projecting the first image pattern, wherein the second image is essentially identical to and laterally shifted with respect to the first image pattern, the second image pattern partially overlaps the first image pattern, and the second image pattern covers the second portion without covering the first and central portions; and
removing portions of the photoresist layer corresponding to the first and second image patterns to selectively expose the first and second portions without exposing the central portion.

16. The method of claim 15, wherein:
projecting the first image pattern onto the photoresist layer includes projecting radiation through a reticle while the reticle has a first position with respect to the substrate; and
projecting the second image pattern onto the photoresist layer includes projecting radiation through the reticle while the reticle has a second position with respect to the substrate, wherein the second position is laterally shifted with respect to the first position so as to laterally shift the second image pattern with respect to the first image pattern.

17. The method of claim 15, wherein:
projecting the first image pattern onto the photoresist layer includes projecting radiation through a first reticle having a first radiation-transmitting pattern; and projecting the second image pattern onto the photoresist layer includes projecting radiation through a second reticle having a second radiation-transmitting pattern, wherein the second radiation-transmitting pattern is essentially identical to and laterally shifted with respect to the first radiation-transmitting pattern so as to laterally shift the second image pattern with respect to the first image pattern.

18. The method of claim 15, wherein the second image pattern is laterally shifted with respect to the first image pattern along a single coordinate axis.

19. The method of claim 15, wherein the second image pattern is laterally shifted with respect to the first image pattern along first and second mutually orthogonal coordinate axes.

20. The method of claim 15, wherein the material is polysilicon.

21. The method of claim 15, wherein the first and second portions are etched and removed, and the central portion forms a gate electrode.

22. The method of claim 15, wherein a length across the central portion between the first and second portions is less than a minimum resolution of a photolithographic system that projects the first and second image patterns onto the photoresist layer.

23. The method of claim 22, wherein the length is less than about 0.4 microns.

24. The method of claim 22, wherein the length is less than about 0.2 microns.

25. A method of selectively exposing a gate material for forming a gate electrode for an IGFET, comprising the following steps in the sequence set forth:
forming a gate oxide on a semiconductor substrate;
forming a polysilicon layer on the gate oxide, wherein the polysilicon layer includes a gate electrode and first and second portions adjacent to opposite ends of the gate electrode;
forming a positive photoresist layer on the polysilicon layer;
projecting a first image pattern onto the photoresist layer using a first radiation exposure, wherein the first image pattern defines a first edge for the gate electrode by covering the first portion without covering the gate electrode and without covering the second portion;
projecting a second image pattern onto the photoresist layer using a second radiation exposure, wherein the second image pattern defines a second edge for the gate electrode by covering the second portion without covering the first portion and without covering the gate electrode, the second image pattern partially overlaps the first image pattern, and the second image pattern is essentially identical to and laterally shifted with respect to the first image pattern; and
removing portions of the photoresist layer corresponding to the first and second image patterns to selectively expose the first and second portions while covering the gate electrode.

26. The method of claim 25, wherein:
the first and second image patterns each include four inner borders within four outer borders;
the inner borders include a first inner border adjacent to a second inner border, a third inner border adjacent to the second inner border and opposing the first inner border, and a fourth inner border adjacent to the first and third inner borders and opposing the second inner border;
the outer borders include a first outer border adjacent to a second outer border, a third outer border adjacent to the second outer border and opposing the first outer border, and a fourth outer border adjacent to the first and third outer borders and opposing the second outer border;

the first and third inner borders of the second image pattern are laterally shifted along a first coordinate axis with respect to the first and third inner borders of the first image pattern, wherein the first coordinate axis is orthogonal to a second coordinate axis;

the first and third outer borders of the second image pattern are laterally shifted along the first coordinate axis with respect to the first and third outer borders of the first image pattern;

the first edge of the gate electrode is defined by the third inner border of the first image pattern; and the second edge of the gate electrode is defined by the first inner border of the second image pattern.

27. The method of claim 26, wherein:

the second and fourth inner borders of the second image pattern are aligned along the second coordinate axis with the second and fourth inner borders of the first image pattern; and the second and fourth outer borders of the second image pattern are aligned along the second coordinate axis with the second and fourth outer borders of the first image pattern.

28. The method of claim 26, wherein:

the second and fourth inner borders of the second image pattern are laterally shifted along the second coordinate axis with respect to the second and fourth inner borders of the first image pattern; and the second and fourth outer borders of the second image pattern are laterally shifted along the second coordinate axis with respect to the second and fourth outer borders of the first image pattern.

29. The method of claim 26, wherein a length of the gate electrode between the first and second edges is equivalent to a distance between the first and third inner borders of the first image pattern minus the lateral shift along the first coordinate axis between the first and second image patterns.

30. The method of claim 26, wherein a width of the gate electrode parallel to the first and second edges is equivalent to a distance between the second and fourth inner borders of the first image pattern minus the lateral shift, if any, along the second coordinate axis between the first and second image patterns.

* * * * *